United States Patent [19]

Geisler et al.

[11] Patent Number: 5,113,790
[45] Date of Patent: May 19, 1992

[54] APPARATUS FOR THE PLASMA TREATMENT OF SUBSTRATES

[75] Inventors: Michael Geisler, Wächtersbach; Michael Jung, Kahl/Main; Rudolf K. Faulhaber, Karben, all of Fed. Rep. of Germany

[73] Assignee: Leybold AG, Hanau, Fed. Rep. of Germany

[21] Appl. No.: 728,258

[22] Filed: Jul. 11, 1991

[30] Foreign Application Priority Data

Mar. 23, 1991 [DE] Fed. Rep. of Germany ....... 4109619

[51] Int. Cl.$^5$ .............................................. C23C 16/00
[52] U.S. Cl. .................................. 118/723; 156/345
[58] Field of Search ......................... 118/723; 156/345

[56] References Cited

U.S. PATENT DOCUMENTS

| 4,328,258 | 5/1982 | Coleman | 118/723 |
| 4,767,641 | 8/1988 | Kieser | 118/723 |

FOREIGN PATENT DOCUMENTS

| 2115590 | 3/1971 | Fed. Rep. of Germany . |
| 2241229 | 8/1972 | Fed. Rep. of Germany . |

OTHER PUBLICATIONS

Chapman, "Glow Discharge Processes", pp. 1, 143, 144.

Primary Examiner—Richard Bueker
Attorney, Agent, or Firm—Felfe & Lynch

[57] ABSTRACT

The invention relates to an apparatus for the plasma treatment of substrates in a plasma discharge excited by radiofrequency between two electrodes 3, 8, supplied by a radiofrequency source, of which the first is configured as a hollow electrode 3 and the second an electrode 8 bearing a substrate 7 is placed in front of the cavity (10) of the first electrode and can be moved past the latter, the hollow electrode being surrounded by a dark-space shielding (14) and has a margin 9 pointing toward the second electrode 8 and projections 12 lying between the margins at the same potential as the first electrode 3. Between the projections 12 permanent magnets 34 are provided by which the substrate bias (self-bias) is adjustable independently of the discharge geometry, the discharge pressure and the radiofrequency power.

12 Claims, 2 Drawing Sheets

APPARATUS FOR THE PLASMA TREATMENT OF SUBSTRATES

BACKGROUND OF THE INVENTION

The invention relates to an apparatus for the plasma treatment of substrates in a plasma discharge excited by radiofrequency between two electrodes supplied by a high-frequency source. The first electrode is configured as a hollow electrode. The second electrode bearing a substrate is placed in front of the hollow chamber of the first electrode and can be moved past the latter. At least the hollow electrode is surrounded by a dark space shield and has edges facing the second electrode, between which projections are provided, which are at the same potential as the first electrode.

Apparatus for the plasma treatment of substrates by radiofrequency commonly contain two electrodes, one of which is formed by the vacuum chamber and/or by the substrate holder, both consisting of metallic materials. It is known that a largely negative voltage is formed with respect to the plasma, which with respect to the surfaces acting as counterelectrode has the smaller active area. The negatively biased electrode is therefore regularly referred to, as it is herein, as the "cathode."

If a plate-like substrate holder is used, which is at the same potential as the vacuum chamber and thus represents the one electrode, and on the other hand a plate-like electrode opposite the substrate holder is used, then, on account of the area ratios necessarily created thereby, the negative potential forms on the latter electrode. Consequently material (=target) that is on this electrode (=cathode) becomes sputtered and precipitated onto the substrate. If it is desired to etch the substrates in such an apparatus, the substrates and target must be changed about accordingly.

If direct current is used, the polarity of the electrodes is necessarily determined by their connection to the particular pole of the direct-current source. German patent disclosure document 21 15 590 discloses the use, for example, of a hollow cathode with a rim raised toward the substrate holder in order to improve the uniformity of the coating thickness. This projecting rim, however, does not result in a reversal of the polarity if direct current is used.

German Patent 22 41 229 discloses an apparatus in which the use of radiofrequency brings it about that the hollow electrode, on account of its rim, has the larger area relative to the surface of the other electrode (substrate holder) directly facing the hollow chamber, and thus functions as an anode, so that, to a certain extent, a reversal of the conditions in regard to the bias takes place. This can be described, in simple terms, by saying that, if there is a sufficiently small distance between this electrode and the edge of the hollow electrode (gap S), the edge of the hollow electrode defines a discharge space in relation to which the metal parts of the apparatus outside of it no longer perform any electrode function, so that the conditions are determined only by the portions of the surface of the hollow electrode which face one another, on the one hand, and the substrate holder on the other. This can be termed the "rim effect."

A coating process of the kind described above is known (U.S. Pat. No. 4,767,641) in which the properties of the deposited coating, or those of the plasma-treated substrate surface, depend on the substrate bias (self-bias) formed between the plasma and the substrate surface. In the production of low-stress quartz coatings a voltage of definitely less than about 600 volts is necessary. In the production of carbon coatings the substrate bias (self-bias), however, must be greater than about 600 volts.

Accordingly, the problem to which the invention is addressed is to configure an apparatus for the plasma treatment of substrates in a plasma discharge, excited by radiofrequency, between two electrodes supplied by a radiofrequency source, of which the first is configured as a hollow electrode, such that the parameter of the self-bias will be variable in a simple manner, independently of other parameters such as radiofrequency, power and pressure.

This problem is solved in accordance with the invention by the fact that, between the projections lying between the edges, means are provided whereby the substrate self-bias is variable independently of the geometry of the discharge, the discharge pressure and the radiofrequency power. By this means the mobility of the electrons is reduced by a transverse magnetic field ($H \leq 100$ KA/m) and to some extent approaches that of the ions, which are virtually unaffected by the magnetic field. The consequence is that the voltage of the marginal layer of the plasma is reduced, and with it the substrate self-bias. This effect is independent of the magnetic field strength, so that, in a surprisingly simple manner the substrate self-bias is variable independently of other parameters. In this manner, furthermore, an increase in the rate of deposition can be achieved. Advantageously, the magnets can also have different field strengths according to the work process. Also, an equalization of the plasma along the y-axis or lengthwise of the projections can thus be achieved. The apparatus according to the invention can advantageously be used as a hollow anode, and also as a hollow cathode. For the latter, the distance between the bottom of the electrode and the counterelectrode is varied accordingly. In this case the magnets bring it about that the plasma becomes denser and more uniform.

SUMMARY OF THE INVENTION

It is furthermore advantageous to provide at least one permanent magnet between each pair of upright, parallel projections.

According to a further development of the apparatus according to the invention, an additional possibility is for the parallel, upright projections and permanent magnets to run between upright sections of the sides or walls of the electrode, especially the hollow electrode.

Lastly, according to a special feature of the invention, it is proposed that the parallel, upright projections and the parallel, upright permanent magnets adjoin the upright sections of the sides or walls of the hollow electrode and that the permanent magnets be given a lower height than the upright projections and/or side sections of the hollow electrode. In this manner the control of the flow of the gas and thus the gas exchange is substantially improved in both directions by simple means.

There is also the possibility for the upright permanent magnets and/or the upright sections of the sides or walls of the hollow electrode to have the same height.

It is of special importance to the present invention that the permanent magnets be disposed on one or more yokes, and that the polarity of each adjacent permanent magnet be the same N/S N/S or preferably opposite N/S S/N.

In connection with this arrangement it is advantageous for several permanent magnets of preferably opposite polarity to be arranged in pairs, and for the electrode, especially the hollow electrode for holding the permanent magnets, be configured as a rectangular electrode and be integrated into a sputtering magnetron.

Regardless of the kind of gas and working pressure, it can furthermore be advantageous for the distance between each two projections and/or between each two permanent magnets to be between 1.5 mm and 150 mm, especially between 15 mm and 25 mm. It is advantageous furthermore for the distance between each projection and an adjacent permanent magnet to be between 0 mm and 80 mm, especially between 3 mm and 8 mm. On account of the different heights of the projections with respect to the permanent magnets, the advantage is obtained at higher pressures of stabilizing the plasma in the area of the projections. Another achievement is that, at lower pressure, the plasma withdraws from this space, i.e., from the range of the projections or of the hollow space, so that plasma still fills only the hollow space between the projections bracketing a permanent magnet. In other words, several smaller hollow electrodes are formed within the entire hollow electrode. Which of the individual cavities is used or filled up by the plasma as electrode surface depends decidedly on the pressure. By and large, the hollow electrode can be operated in a greater range of parameters. If, for example, silicon dioxide is to be deposited in a coating process, the appropriate substrate self-bias can be selected without the need to change the discharge geometry; it is necessary only to use magnetic fields of different strength to the limit of field strength zero.

An additional possibility, according to a further development of the apparatus according to the invention, is that the surface area contained within the first electrode is variable by projections and/or by permanent magnets.

The pattern of the flow of gas is improved by the advantageous labyrinthine arrangement of the individual projections and the permanent magnets of different height situated between them.

In further development of the invention, it is advantageous to make at least portions of the hollow electrode of sintered metal. It is also advantageous for at least both of the electrodes to be surrounded each by a dark-space shield, and for the hollow electrode to have projections raised toward the second electrode and lying between the margins, and placed at the same potential as the first electrode.

Additional features of the invention are described and represented in the subordinate claims, description and figures, and it is to be noted that all individual features and all combinations of individual features are important to the invention.

DETAILED DESCRIPTION OF THE PREFERRED EMBODIMENTS

Figure 1:
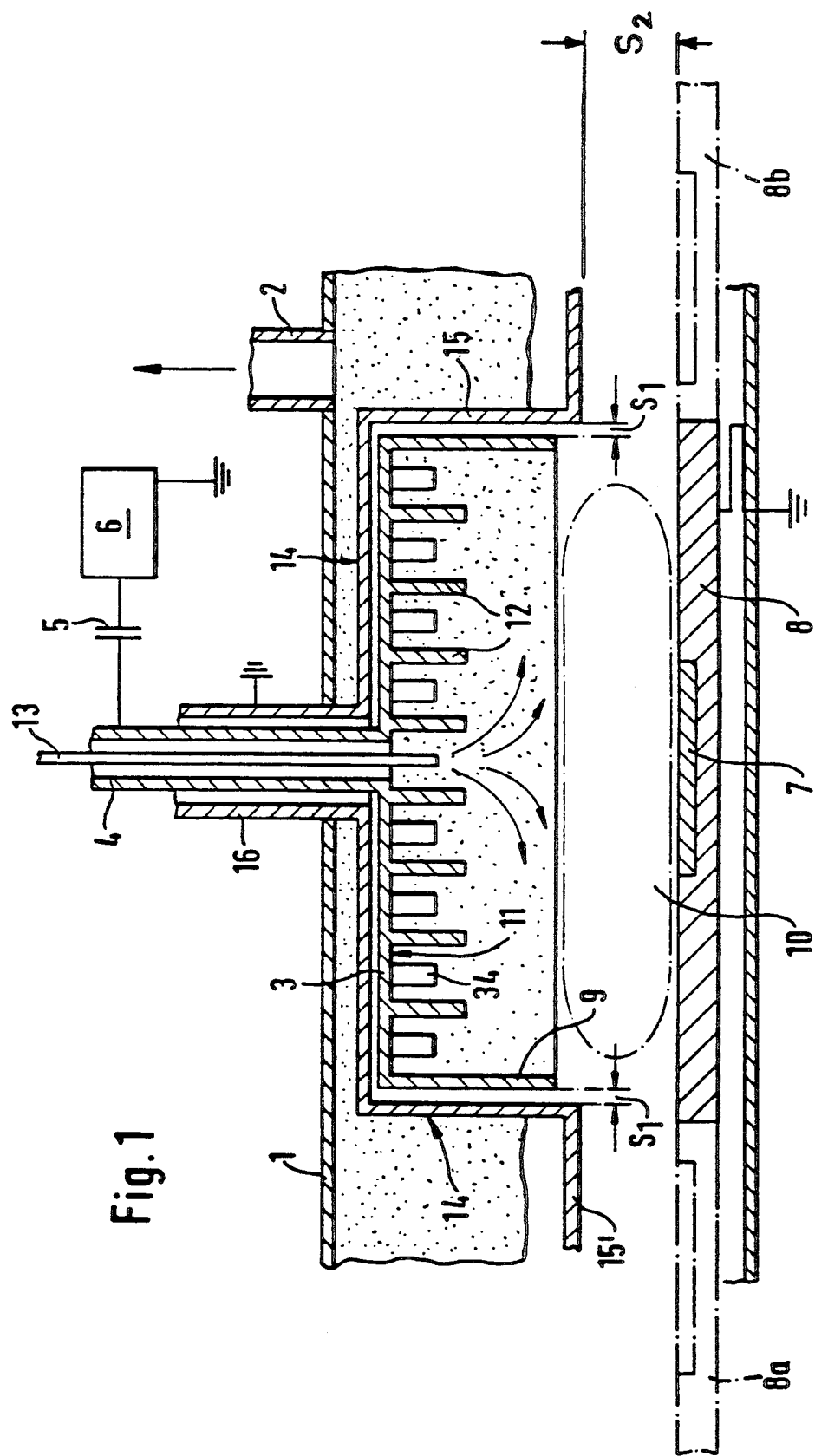
FIG. 1 is a vertical axial section through a complete apparatus through which plate-like substrate holders are passed, and a hollow electrode.

In FIG. 1 a vacuum chamber 1 is depicted, which can be evacuated through a suction connection 2 to a pressure commonly used for PCVD processes. Into the cover of the vacuum chamber 1 there is inserted a hollow electrode 3 which is connected via an electrically conductive holding means 4 and a condenser 5 and adapter network not shown, to a radiofrequency source 6. Underneath the hollow electrode 3 is a second electrode 8 bearing a substrate 7 and forming one of the substrate holders. In the example, the hollow electrode 3 has on its entire circumference of rectangular plan a rim 9 reaching toward the electrode 8 and at the same potential as the hollow electrode 3; the rim 9 forms a dark-space gap "$S_1$" all around it of, for example, 2 mm between it and the grounded shield 15, and a gap $S_2$ with the electrode 8. The rim 9 can be supplemented by a second rim not shown in the drawing.

The area of the metal surfaces acting as counter-electrodes (electrode 8) to electrode 3 can be varied by inserting parts or projections 12. They are secured by fastening means not shown in the drawing.

The potential that establishes itself between the plasma and the electrode 8 in position 8a determines the energy with which the positive ions are accelerated toward the substrates 7, that is, the coating growth is greatly influenced by the energy with which the ions impinge upon the substrate 7. By the advantageous installation of the continuation 15' of the margin 15 the ion energy can be affected independently of other parameters.

Formerly the ion energy could be appreciably controlled only by varying the radiofrequency power. In order, for example, to reduce the ion energy while keeping the discharge pressure the same, the radiofrequency power was reduced. This also reduced the deposition rate and productivity, and consequently in many cases it reduced the quality of the coating.

It is furthermore especially advantageous also to extend the margin 15 of the dark-space shielding 14 with the continuation 15'. This assures that the plasma will find no undesirable counterelectrode and will burn only where it is desired.

Figure 2:
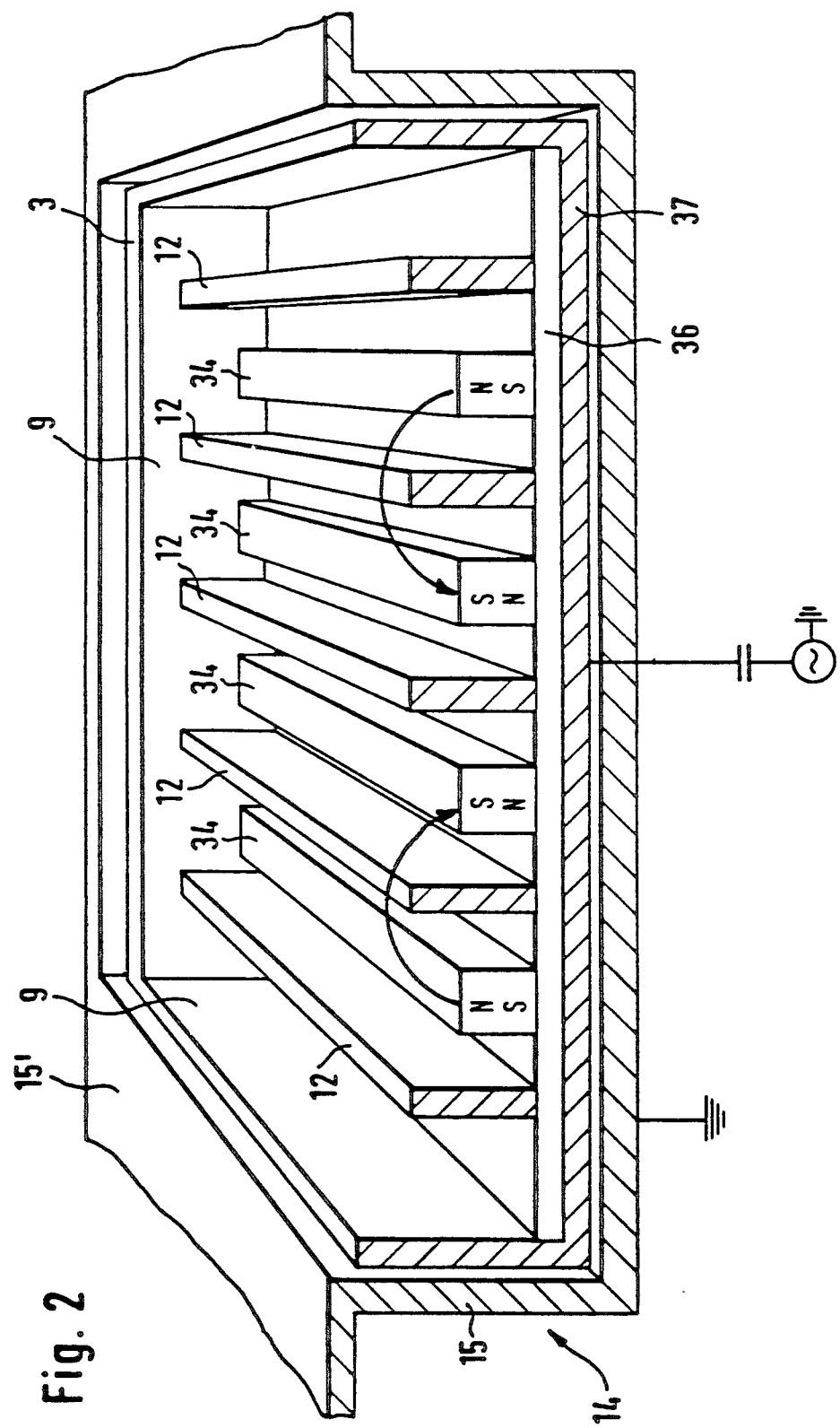
FIG. 2 is a perspective cross section through the hollow electrode according to the invention with permanent magnets disposed in pairs.

The hollow electrode 3 consequently surrounds a hollow space 10 whose inside surface area 11 is increased by projections 12 which are formed by parallel, upstanding ribs (see also FIG. 2). For the spacing of these projections 12 the rule is that it must be substantially greater than the dark-space interval at the applied vacuum. At a vacuum of about $2 \times 10^2$ mbar the distance of the projections from one another and from the rim 9 can amount to about 20 mm. The height of the projections in this case is not limited, but in the interest of good uniformity of the deposition rate distribution in the vicinity of the substrate 7 should not be less than about half the height of rim 9; the optimum projection height depends on the working pressure and the composition of the gas. These relationships are represented approximately to scale in FIG. 1.

The bottom circumferential, rectangular edge of the rim 9 is at a distance $S_1$ from the margin 15; this gap represents the opening of the hollow electrode 3.

The hollow electrode 3, with the exception of the bottom opening, is surrounded on all sides by the parallelepipedal dark-space shielding 14 whose rim 15 can be supplemented by projections or flanges 15'. The entrance and exit of the unconsumed reaction products of the infed gases takes place through the gaps $S_1$ and/or through certain gas supply devices, not shown in the drawing, which can be installed in margin 15.

The dark-space shielding 14 is conductively connected by an additional holding means 16 to the vacuum chamber, and consequently it is at ground potential with the vacuum chamber 1.

At the right and left end the vacuum chamber 1 is connected to a vacuum lock not here illustrated, through which the electrodes 8 serving as substrate holders are introduced sequentially into the apparatus and again removed therefrom. The electrode 8 is represented in broken lines on its path in two additional positions 8a and 8b.

As it appears in the embodiment in FIG. 2, the hollow electrode 3 consists of a soft magnetic yoke 36 in one piece or several pieces, and of the rim sections 9 and a bottom 37 on which the yoke 36 is laid.

Between the front rim section 9, omitted from the drawing, and the rear rim section are numerous projections 12 standing upright on the yoke 36 and abutting at their ends against the opposite rim sections 9.

In FIG. 2 fewer projections 12 are represented than in the embodiment of FIG. 1. The number of projections 12 depends on the power input, on the size of the hollow electrode 3 and the working pressure and gas composition.

As it can be seen in FIGS. 1 and 2, the projections 12 are made slightly smaller than the rim 9 of the hollow electrode 3. Between the projections 12 situated between the rim sections 9, permanent magnets 34 are provided, by which the substrate self-bias can be adjusted independently of the discharge geometry, discharge pressure and radiofrequency power. The individual, parallel, upright projections 12 have a greater height than the permanent magnets 34.

The polarity of the adjacent permanent magnets 34 can be alike N/S N/S (see FIG. 2) or preferably, however, opposite (N/S S/N). Furthermore, it is possible for several permanent magnets 34 of like polarity to be arranged in pairs.

The typical distance between projections 12 and/or between permanent magnets 34 amounts to between 15 mm and 25 mm, especially 20 mm, while the distance between one projection 12 and an adjacent permanent magnet 34 can be between 3 mm and 8 mm, especially 5 mm.

Since the hollow electrode 3 is configured as a rectangular electrode, the individual permanent magnets 34 have each a beginning and an end abutting against the corresponding rim section 9 of the hollow electrode 3.

The effect of the magnets on the substrate self-bias voltage was demonstrated in a series of tests. The strength of the magnets was varied. The polarity of the magnets was as shown in FIG. 2. These tests were performed in an azethylene atmosphere at a discharge pressure of 1.5 Pa and a base frequency power of 750 watts (=1.8 watts/cm$^2$ of cathode surface). Silicon plates were coated with a depth of 100 mm of amorphous hydrogenated carbon (a—C:H). Such coatings are used in the protective coating of thin-film magnetic memory wafers with an especially great storage density.

The result of the test is represented in the following table:

| Source field strength of magnets in KA/m | Radiofrequency substrate bias in KV |
|---|---|
| 0 | 1.0 |
| 130 | 0.75 |
| 215 | 0.35 |

In all cases the uniformity of the deposition rate distribution was better than ±2%. It was found that the uniformity of the rate distribution when the magnets are used can be obtained only if the magnets are used in conjunction with the electrode projections 12.

This shows that, with the system according to the invention, the substrate self-bias can be varied within wide limits and the deposition rates can be additionally reduced or increased by a factor of 1.7 without the need to vary the discharge geometry, the discharge pressure, or the RF power.

We claim:

1. Apparatus for the plasma treatment of electrically biased substrates in a plasma discharge having a geometry and pressure, said discharge being excited by radiofrequency power, comprising
   a first electrode constructed as a hollow electrode comprising a bottom and a sidewall extending from said bottom to define a hollow space, and a plurality of parallel projections extending from said bottom into said hollow space,
   a radiofrequency source connected to said first electrode,
   a second electrode opposite said first electrode with said hollow space therebetween,
   a dark space shield having a margin surrounding said sidewall and extending toward said second electrode, and
   means between said projections for adjusting the substrate bias independently of the discharge geometry, the discharge pressure, and the radiofrequency power.

2. Apparatus as in claim 1 wherein said means between said projections comprises a plurality of permanent magnets.

3. Apparatus as in claim 2 wherein at least one permanent magnet is provided between each pair of projections.

4. Apparatus as in claim 2 wherein each projection extends to said sidewall.

5. Apparatus as in claim 2 wherein said permanent magnets extend to said sidewall.

6. Apparatus as in claim 2 wherein said permanent magnets have a lower height than said projections.

7. Apparatus as in claim 2 further comprising a magnetic yoke on which said magnets are disposed, said magnets lying in at least two rows.

8. Apparatus as in claim 7 wherein the polarity of magnets in at least two adjacent rows is opposite.

9. Apparatus as in claim 2 wherein said permanent magnets are situated in rows between said projections, said rows being 15-25 mm apart.

10. Apparatus as in claim 2 wherein said permanent magnets are situated in rows between said projections, said rows being spaced 3-8 mm from adjacent projections.

11. Apparatus as in claim 1 wherein said first electrode comprises sintered metal.

12. Apparatus as in claim 1 wherein said margin of said dark space shield has an extension extending outwardly thereof, away from said first electrode.

* * * * *

UNITED STATES PATENT AND TRADEMARK OFFICE
CERTIFICATE OF CORRECTION

PATENT NO. : 5,113,790

DATED : May 19, 1992

INVENTOR(S) : Geisler et al.

It is certified that error appears in the above-identified patent and that said Letters Patent is hereby corrected as shown below:

Column 2, line 4, after line 4, insert --SUMMARY OF THE INVENTION --.

Column 2, line 41, delete "SUMMARY OF THE INVENTION".

Signed and Sealed this

Twenty-first Day of September, 1993

*Attest:*

BRUCE LEHMAN

*Attesting Officer*     *Commissioner of Patents and Trademarks*